US008873782B2

(12) United States Patent
Scheller

(10) Patent No.: US 8,873,782 B2
(45) Date of Patent: Oct. 28, 2014

(54) SEPARATE INNER AND OUTER HAIR CELL LOSS COMPENSATION

(71) Applicant: Starkey Laboratories, Inc., Eden Prairie, MN (US)

(72) Inventor: Thomas A. Scheller, Eden Prairie, MN (US)

(73) Assignee: Starkey Laboratories, Inc., Eden Prairie, MN (US)

( * ) Notice: Subject to any disclaimer, the term of this patent is extended or adjusted under 35 U.S.C. 154(b) by 0 days.

(21) Appl. No.: 13/722,960

(22) Filed: Dec. 20, 2012

(65) Prior Publication Data

US 2014/0177891 A1 Jun. 26, 2014

(51) Int. Cl.
*H04R 25/00* (2006.01)

(52) U.S. Cl.
CPC .................................... *H04R 25/50* (2013.01)
USPC .......................................... 381/321; 381/312

(58) Field of Classification Search
USPC ................................................. 381/312–331
See application file for complete search history.

(56) References Cited

U.S. PATENT DOCUMENTS

| | | | |
|---|---|---|---|
| 6,970,570 | B2 | 11/2005 | Goldstein |
| 8,290,190 | B2 * | 10/2012 | Hau et al. ................... 381/320 |
| 2006/0078140 | A1 | 4/2006 | Goldstein |
| 2010/0085117 | A1 | 4/2010 | Moon et al. |
| 2011/0013794 | A1 | 1/2011 | Hau et al. |
| 2012/0177205 | A1 | 7/2012 | Bramsloew et al. |

FOREIGN PATENT DOCUMENTS

CA      2090531 A1      8/1994

OTHER PUBLICATIONS

Banerjee, Shilpi, "The Compression Handbook", Third Edition. Starkey,, (2011), 60 pgs.
Kates, James M, "Principles of Digital Dynamic-Range Compression", Trends in Amplification, 9(2), (2005), 45-76.
Nikoleta, Garini, "Compression Techniques for Digital Hearing Aids", (Sep. 15, 2009), 77 pgs.
White, M. W, "Compression Systems for Hearing Aids and Cochlear Prostheses", Journal of Rehabilitation Research and Development, 23(1), (1986), 25-39.
Zhak, Serhii M, et al., "A Low Power Wide Dynamic Range Envelope Detector", [online]. Retrieved from the Internet: <URL: https://dspace.mit.edu/bitstream/handle/1721.1/6743/TR%23664.pdf?sequence=1>, (Accessed on Dec. 6, 2013), 13 pgs.
"European Application Serial No. 13196832.3, Extended European Search Report mailed May 6, 2014", 8 pgs.
Schneider, Todd, et al., "A multichannel compression strategy for a digital hearing aid", IEEE International Conference on Acoustics, Speech, and Signal Processing, vol. 1., (Apr. 21, 1997), 411-414.

* cited by examiner

*Primary Examiner* — Brian Ensey
*Assistant Examiner* — Norman Yu
(74) *Attorney, Agent, or Firm* — Schwegman Lundberg & Woessner, P.A.

(57) ABSTRACT

A method and device for compensating sensorineural hearing loss in a manner that allows dysfunction of the inner and outer hair cells to be separately compensated is described. The disclosed techniques involve providing separately adjustable compression pathways for the received sound.

20 Claims, 7 Drawing Sheets

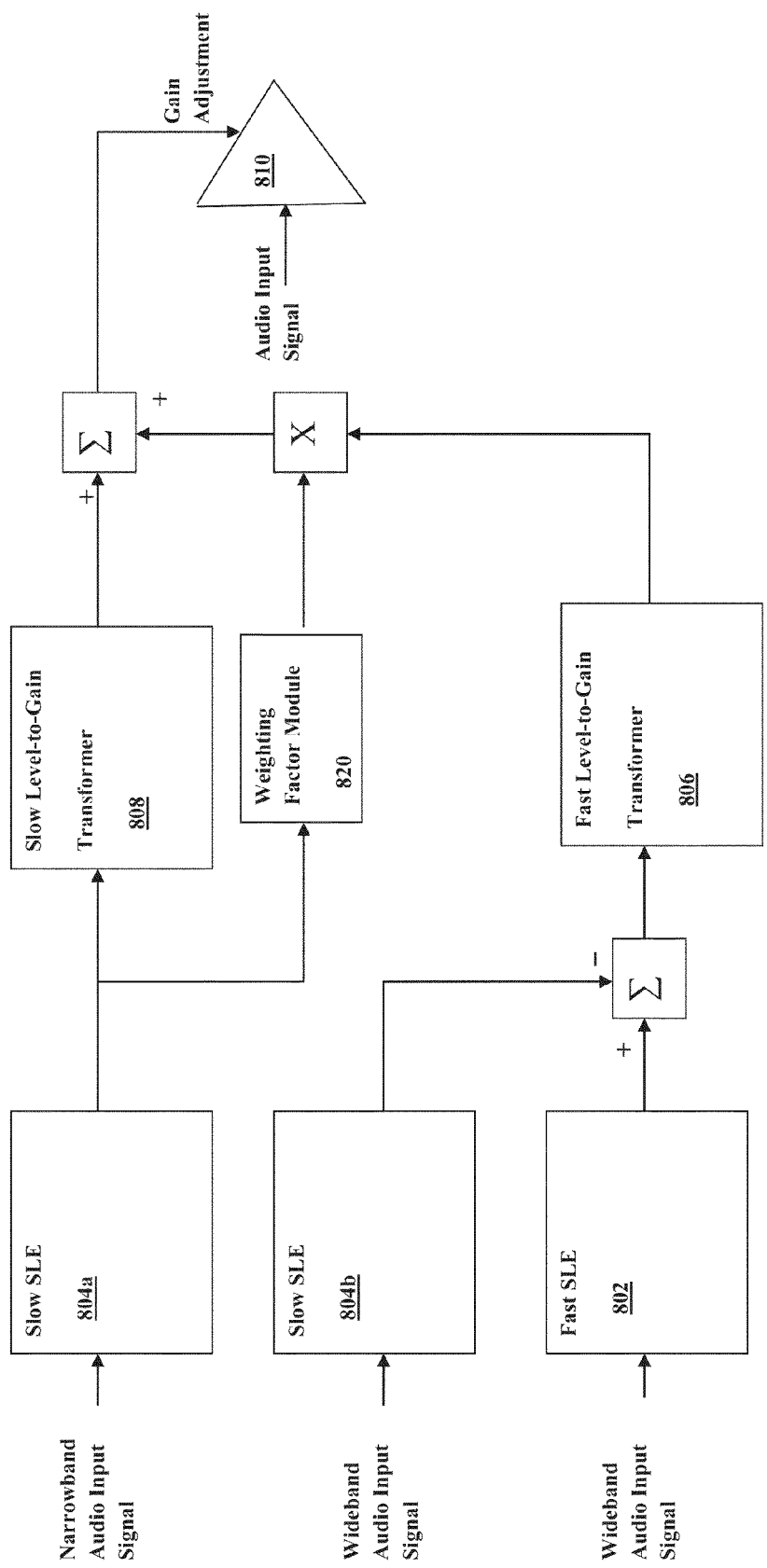

SEPARATE INNER AND OUTER HAIR CELL LOSS COMPENSATION

FIELD OF THE INVENTION

This invention pertains to devices and methods for treating hearing disorders and, in particular, to electronic hearing aids.

BACKGROUND

Hearing aids are electronic instruments worn in or around the ear that compensate for hearing losses by amplifying and processing sound so as to help people with hearing loss hear better in both quiet and noisy situations. Most commonly, hearing loss results from damage to the small sensory cells in the cochlea of the inner ear, referred to as sensorineural loss. Such damage can occur as a result of disease, aging, or injury from noise or certain medicines.

As sound waves enter the ear, they travel through the outer ear, the external auditory canal, and strike the eardrum causing it to vibrate. The eardrum transmits the sound vibrations through the ossicles to oval window and thence to the cochlea. The cocheal is a fluid-filled bony structure that contains the receptor organ for hearing, called the organ of Corti. The organ of Corti consists of tiny hair cells that translate the fluid vibration of sounds within the cochlea into electrical impulses that are carried to the brain by sensory nerves.

The cochlea has two types of hair cells: inner hair cells and outer hair cells (IHC and OHC, respectively) that provide very different functionality. The OHC provide a near-instantaneous compressive mechanical amplification that is frequency-specific and place-specific. The IHC transduce the acoustic input into neural patterns to be sent to the brain. For any given hearing loss, there is usually a mixture of damage to these two hair cell types. The compensation for one type, however, is unlikely to be optimal in compensating for the other. Described below is a method and system for addressing this problem.

BRIEF DESCRIPTION OF THE DRAWINGS

FIG. 8 illustrates a compressor according to one example embodiment.

DETAILED DESCRIPTION

Described herein are methods and devices for compensating sensorineural hearing loss in a manner that allows dysfunction of the inner and outer hair cells to be separately compensated. As will be explained, the disclosed techniques involve providing separately adjustable compression pathways for the received sound.

Example Hardware Description

Figure 1:
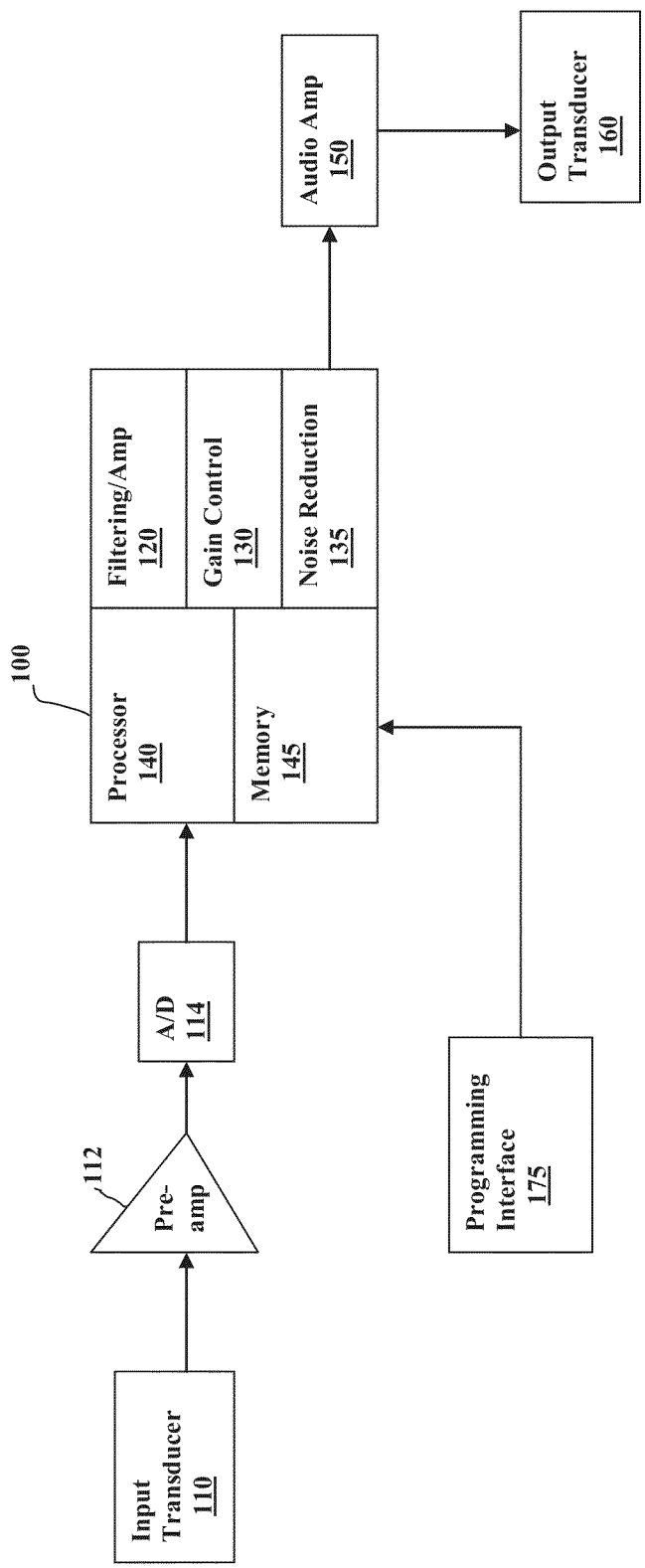
FIG. 1 is a block diagram of the components of an example hearing aid.

A hearing aid is a wearable electronic device for correcting hearing loss by amplifying sound. The electronic circuitry of the device is contained within a housing that is commonly either placed in the external ear canal or behind the ear. Transducers for converting sound to an electrical signal and vice-versa may be integrated into the housing or external to it. The basic components of an exemplary hearing aid are shown in FIG. 1. A microphone or other input transducer 110 receives sound waves from the environment and converts the sound into an input signal. After amplification by pre-amplifier 112, the signal is sampled and digitized by A/D converter 114. Other embodiments may incorporate an input transducer that produces a digital output directly. The device's signal processing circuitry 100 processes the digitized input signal IS into an analog output signal OS in a manner that compensates for the patient's hearing deficit. The output signal OS is then passed to an audio amplifier 150 that drives an output transducer 160 for converting the output signal into an audio output, such as a speaker within an earphone.

In the embodiment illustrated in FIG. 1, the signal processing circuitry 100 includes a programmable controller made up of a processor 140 and associated memory 145 for storing executable code and data. The overall operation of the device is determined by the programming of the controller, which programming may be modified via a programming interface 210. The programming interface 175 allows user input of data to a parameter modifying area of the memory 145 so that parameters affecting device operation may be changed. The programming interface 175 may allow communication with a variety of devices for configuring the hearing aid such as industry standard programmers, wireless devices, or belt-worn appliances.

The signal processing circuitry 100 may be implemented in a variety of different ways, such as with an integrated digital signal processor or with a mixture of discrete analog and digital components. For example, the signal processing may be performed by a mixture of analog and digital components having inputs that are controllable by the controller that define how the input signal is processed, or the signal processing functions may be implemented solely as code executed by the controller. The terms "controller," "module," or "circuitry" as used herein should therefore be taken to encompass either discrete circuit elements or a processor executing programmed instructions contained in a processor-readable storage medium.

The signal processing modules 120, 130, and 135 may represent specific code executed by the controller or may represent additional hardware components. The processing done by these modules may be performed in the time-domain or the frequency domain. In the latter case, the input signal is discrete Fourier transformed (DFT) prior to processing and then inverse Fourier transformed afterwards to produce the output signal for audio amplification. Any or all of the processing functions may also be performed for a plurality of frequency-specific channels, each of which corresponds to a frequency component or band of the audio input signal. Because hearing loss in most patients occurs non-uniformly over the audio frequency range, most commonly in the high frequency range, the patient's hearing deficit is compensated by selectively amplifying those frequencies at which the patient has a below-normal hearing threshold. The filtering and amplifying module 120 may therefore amplify the input signal in a frequency specific manner. The gain control module 130 dynamically adjusts the amplification in accordance with the amplitude of the input signal to either expand or compress the dynamic range and is sometimes referred to as a compressor. Compression, as described more fully below, decreases the gain of the filtering and amplifying circuit at high input signal levels so as to avoid amplifying louder sounds to uncomfortable levels. The gain control module may also apply such compression in a frequency-specific manner. The noise reduction module 135 performs functions such as suppression of ambient background noise and feedback cancellation.

Compression

The primary function of a compressor is to decrease the range of sound levels in the environment so as to better match the dynamic range of a person with hearing impairment. A compressor thus compensates for the reduced dynamic range found in an impaired ear and the increased loudness growth that typically accompanies hearing loss. The compression function is basically an adjustment of the amplification gain to be applied to an audio input signal as a function of the level (i.e., amplitude) of the audio input signal. A basic component of a compressor is a signal level estimator (SLE) that includes a rectifier for obtaining the absolute value of the input signal, a low-pass filter (LPF), and a logarithmic transformer for transforming the linear low-pass filtered values to logarithmic values. References to a "fast" or "slow" SLE should be understood to refer to the time constants of the SLE's low-pass filter being short or long, respectively.

A compressor may be characterized by its dynamic characteristics which refer to how the compressor reacts to changes in the input signal level. The attack time is the time it takes for the compressor to react to an increase in input signal level, while the release time is the time it takes to react to a decrease in input signal level. These parameters are determined by the time constants of the LPF in the SLE used to determine the level of the audio input signal. As the terms are used herein, the attack time refers to the rise time constant of the LPF, while the release time refers to the decay time constant of the LPF.

A compressor is also characterized by its static characteristics that refer to how the compressor reacts to sustained input signal levels. The static characteristics may be represented by a function that maps input signal level values to gain values, referred to herein as a level-to-gain transform. The compression ratio (CR) is the ratio between a change in input signal level and the corresponding change in gain to which it is mapped.

A compression threshold refers to an input signal level at which the compression ratio changes.

Separate Compensation for IHC and OHC Loss

As described below, separate compensation for IHC and OHC loss may be provided via a combination of two parallel gain calculations implemented as parallel compressors. A slow gain calculation based upon a relatively long-term level of the input signal's envelope results in a gain that would amplify the input signal (e.g., normal speech) to a region of maximum IHC transduction. At the same time, the slow change in gain acts to minimize distortion of the signal, contributing to high sound quality. A separate calculation of the near instantaneous deviation of the input signal envelope from the longer-term level drives a fast gain calculation. This fast gain calculation acts to compensate for the OHC loss and may be additionally modified to minimize extreme transients in the instantaneous level. The outputs of the two gain calculations are then combined and applied to amplify the input signal.

With separate IHC and OHC loss-compensation mechanisms, each can be optimized to its own individual compensation task. The IHC loss-compensation acts to move the signal into a region of maximally efficient transduction, with minimal distortion to the transduced signal. The OHC loss-compensation acts to replace some of the lost fast acting compression normally provided by healthy OHC. Unlike previous approaches that only attempt to find a reasonable compromise between competing advantages and disadvantages for an overall goal, the use of separate compensation mechanisms for IHC and OHC loss compensation allows each mechanism to be optimized separately. For example, it is well established that large amounts of very fast multi-channel compression results in poor sound quality. However, small amounts of very fast multichannel compression have been shown to provide acceptable sound quality. The fast OHC compensation can be constrained to remain within this boundary, without constraining the system overall.

Figure 2:
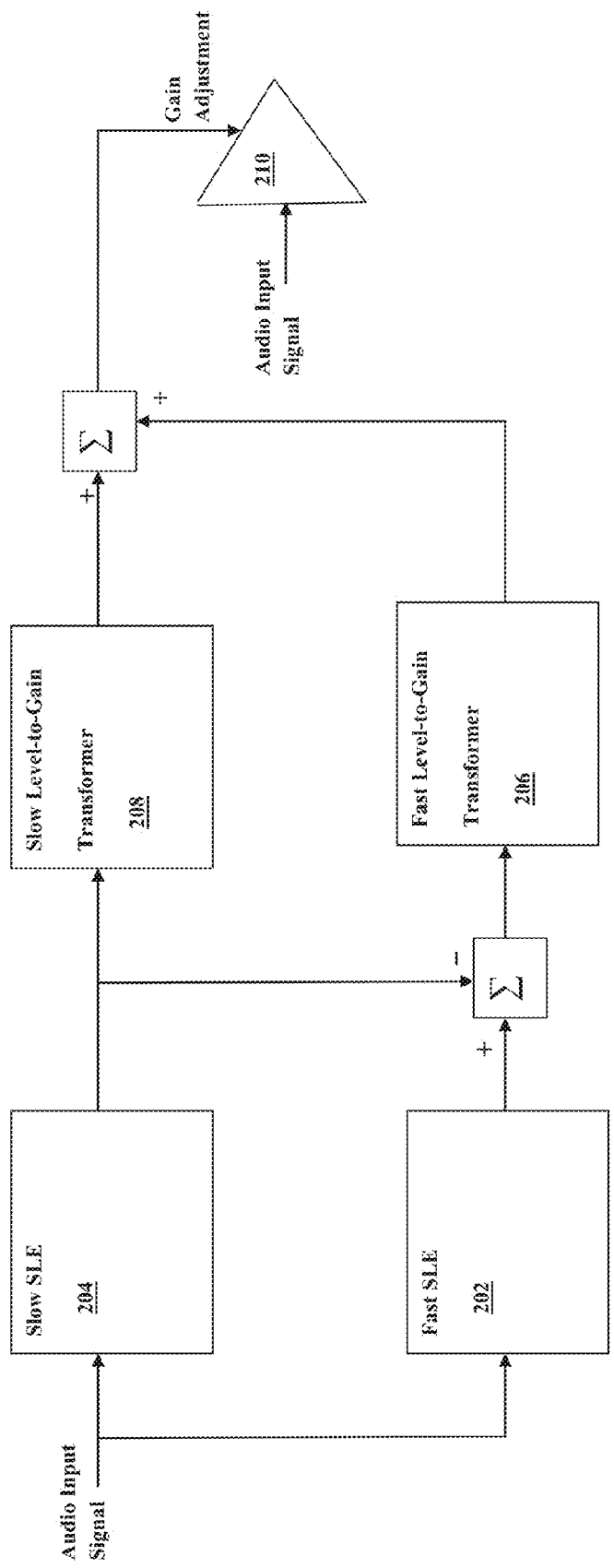
FIG. 2 illustrates a compressor according to one example embodiment.

An example embodiment of a system with two separate parallel gain calculations is shown in FIG. 2 which is described more fully below. The upper path, containing the compensation for IHC loss, comprises a slow filter of the instantaneous input signal level, which feeds the slow level-to-gain transform. The lower path, containing the compensation for OHC loss, consists of a fast smoothing of the instantaneous input signal level as compared to the slow-moving envelope of the input level, the difference between the two being converted to a gain value via the fast level-to-gain calculation. The two gain values are then summed and applied to the signal.

Figure 3:
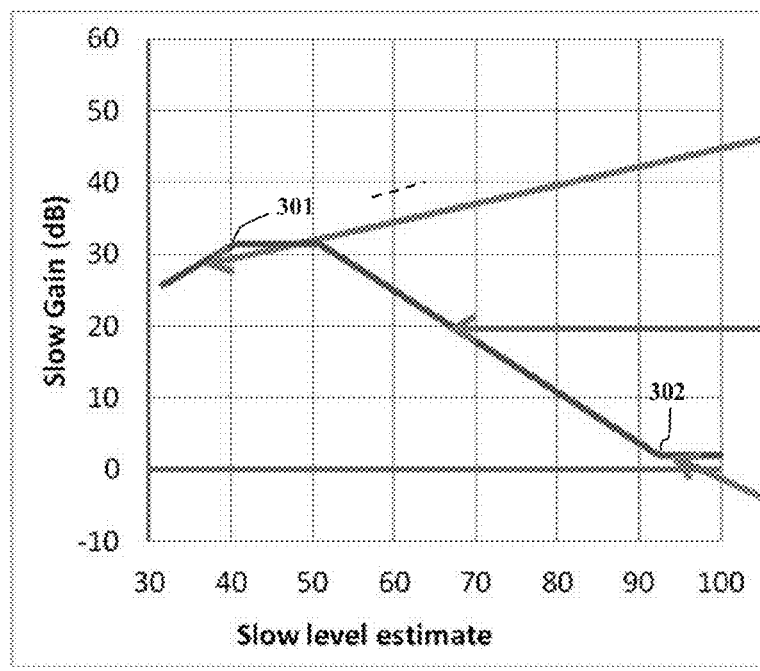
FIG. 3 illustrates an example of the slow level-to-gain transform.

An example of the slow level-to-gain transform (compensating for IHC loss) is shown in FIG. 3. The IHC loss compensation can be thought of as a slow moving, inter-environmental gain adjustment. As such, expansion can be built into the IHC compensation. The time constants for the slow low pass filter can be set over a wide range, with the general goal of adjusting for the overall input level without distorting the signal. Values in the range of one second, for example, could be appropriate. As shown in FIG. 3, the slow level-to-gain transformer may characterized by expansion below a specified compression threshold 301 of the output of the slow SLE that corresponds to speech. The slow level-to-gain transformer may be characterized by a region of linear gain at high input levels above a threshold 302 to minimize distortion.

Figure 4:
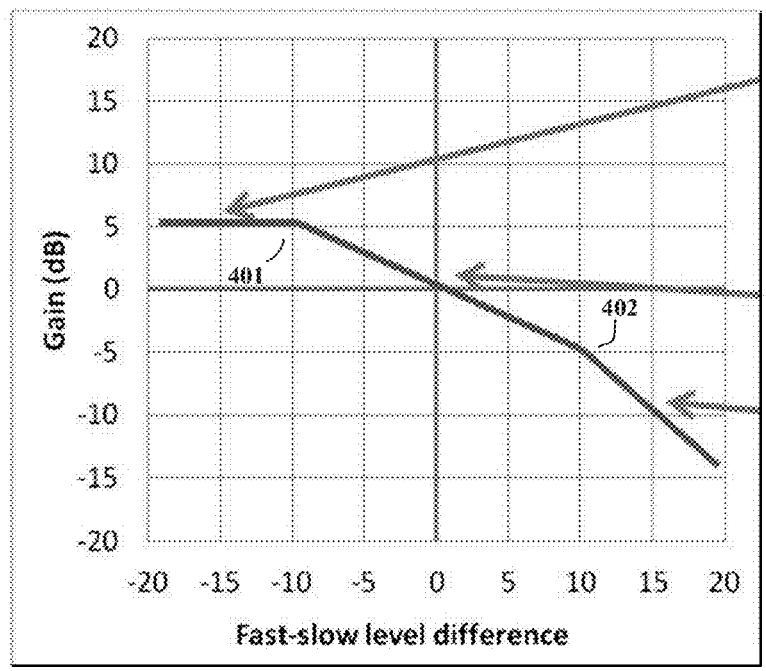
FIG. 4 illustrates an example of the fast level-to-gain transform.

An example of the fast level-to-gain transform (compensating for OHC loss) is shown in FIG. 4. The OHC loss compensation is intended to substitute for the lost OHC's mechanical compression, which operate extremely fast (e.g., less than 1 millisecond). To do this, the time constants for the low pass filter (LPF) of the fast SLE should be short. However, there are competing requirements of minimizing signal distortion. The time constants can be set over a wide range, with the general goal of quickly adjusting the gain without distorting the signal. Values in the range of 10-100 milliseconds may be appropriate. The fast level-to-gain transform may also include a transient minimization feature. As shown in FIG. 4, the fast level-to-gain transform may be characterized by having higher and lower compression thresholds. The fast level-to-gain transform may be characterized by outputting a constant gain value at input levels below the lower compression threshold 401 and may be characterized by compression limiting at input levels above the higher compression threshold 402.

As noted above, the processing functions may be performed for a plurality of frequency-specific channels. It should be recognized that time constants for each of the slow level-to-gain and fast level-to-gain transformers may vary with frequency.

Figure 5:
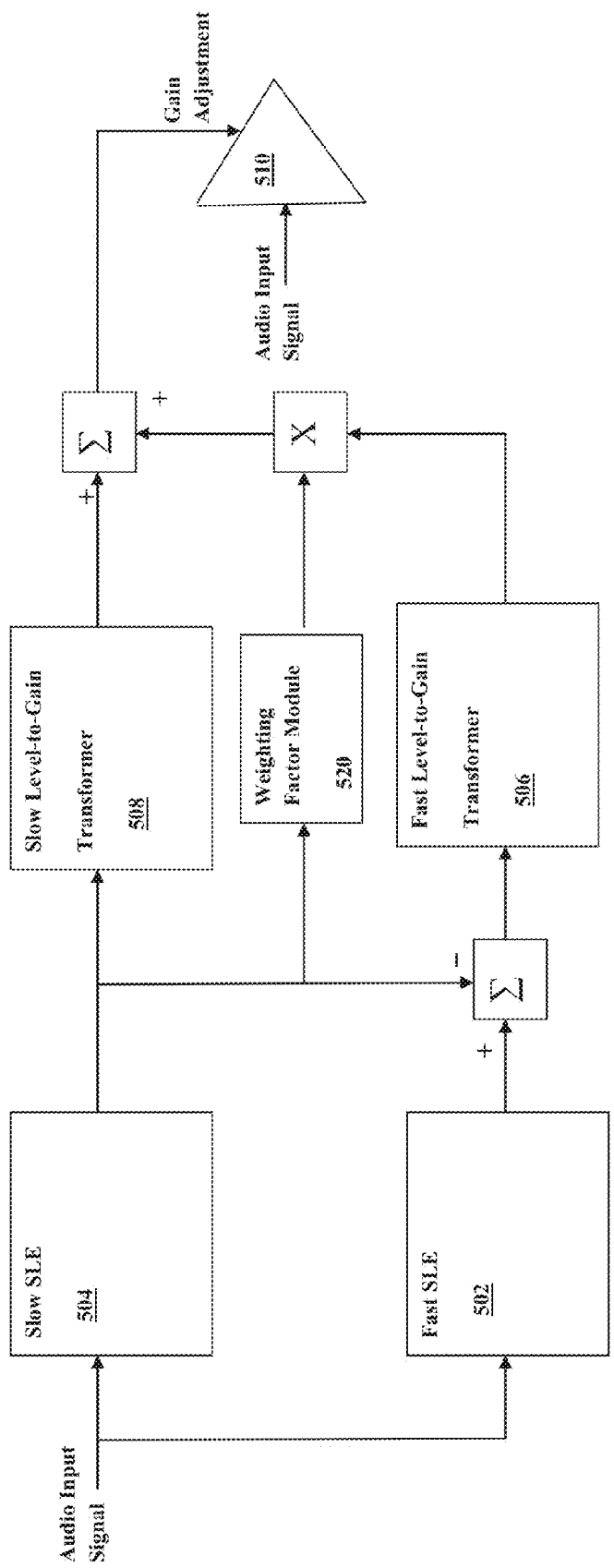
FIG. 5 illustrates a compressor according to one example embodiment.
Figure 6:
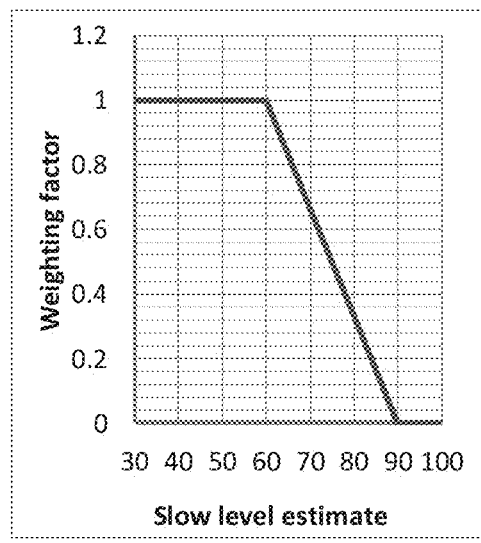
FIG. 6 illustrates an example of a function for mapping input levels to weighting factors.

A characteristic of the fast OHC loss compensation as described above is that it operates equally over the entire input dynamic range. Healthy OHC have a maximal effect over the range of ~30-90 dB SPL, and loss of OHC begins to affect the softer part of this range before the louder part. Consequently, in another embodiment, a refinement would be to limit the fast OHC compensation to a smaller input dynamic range. This could be accomplished in several ways. One example would be to insert a weighting function at the output of the OHC loss compensation, as shown in FIG. 5 which is described more fully below. Here a weighting factor is inserted between the OHC loss compensation and the summation with the IHC compensation, where the weighting factor may be based on the long-term level. An example of a function that maps the long-term level to a specific weighting factor value is shown in FIG. 6. The advantage of this is that OHC loss compensation would not be applied at very high levels, consistent with normal OHC function at these levels. The weighting function could be easily modified to accommodate specific knowledge of an individual's OHC loss as compared with normal OHC function.

In another embodiment, the output of the slow SLE is subtracted from the audio signal, with the difference being passed through a fast SLE and finally through the fast level-to-gain transform. This would provide near instantaneous OHC compensation. An example of this embodiment is shown in FIG. 7 as described more fully below.

In a first example embodiment as illustrated by FIG. 2, a device for compressing an audio signal comprises: a fast signal level estimator (fast SLE) 202 and a signal level estimator (slow SLE) 204 for receiving the audio signal with each SLE having a low-pass filter being characterized by a rise time constant and a decay time constant, a fast level-to-gain transformer 206 for transforming a signal level estimate to a gain value, a slow level-to-gain transformer 208 for transforming a signal level estimate to a gain value, and an output amplifier 210 having an adjustable gain for amplifying the audio signal. The circuitry of the device is configured such that the output of the slow SLE 204 is subtracted from the output of the fast SLE 202 and then input to the fast level-to-gain transformer 206, the output of the slow SLE 204 is input to the slow level-to-gain transformer 208, and the gain values of the fast level-to-gain transformer 206 and the slow level-to-gain transformer 208 are summed to adjust the gain of the output amplifier 210.

In a second example embodiment as illustrated by FIG. 5, a device for compressing an audio signal comprises: a fast signal level estimator (fast SLE) 502 and a slow signal level estimator (slow SLE) 504 for receiving the audio signal with each SLE having a low-pass filter characterized by a rise time constant and a decay time constant, a fast level-to-gain transformer 506 for transforming a signal level estimate to a gain value, a slow level-to-gain transformer 508 for transforming a signal level estimate to a gain value, and an output amplifier 510 having an adjustable gain for amplifying the audio signal. Similar to the first example embodiment, the circuitry of the device is configured such that the output of the slow SLE 504 is subtracted from the output of the fast SLE 502 and then input to the fast level-to-gain transformer 506, the output of the slow SLE 504 is input to the slow level-to-gain transformer 508, and the gain values of the fast level-to-gain transformer 506 and the slow level-to-gain transformer 508 are summed to adjust the gain of the output amplifier 510. In this embodiment, the gain value of the fast level-to-gain transformer 506 is multiplied by a weighting factor by weighting factor module 520 before being summed with the gain value of the slow level-to-gain transformer 508. The weighting factor may be computed by the weighting factor module 520 as a function of the output of the slow SLE 504 as shown in FIG. 5.

Figure 7:
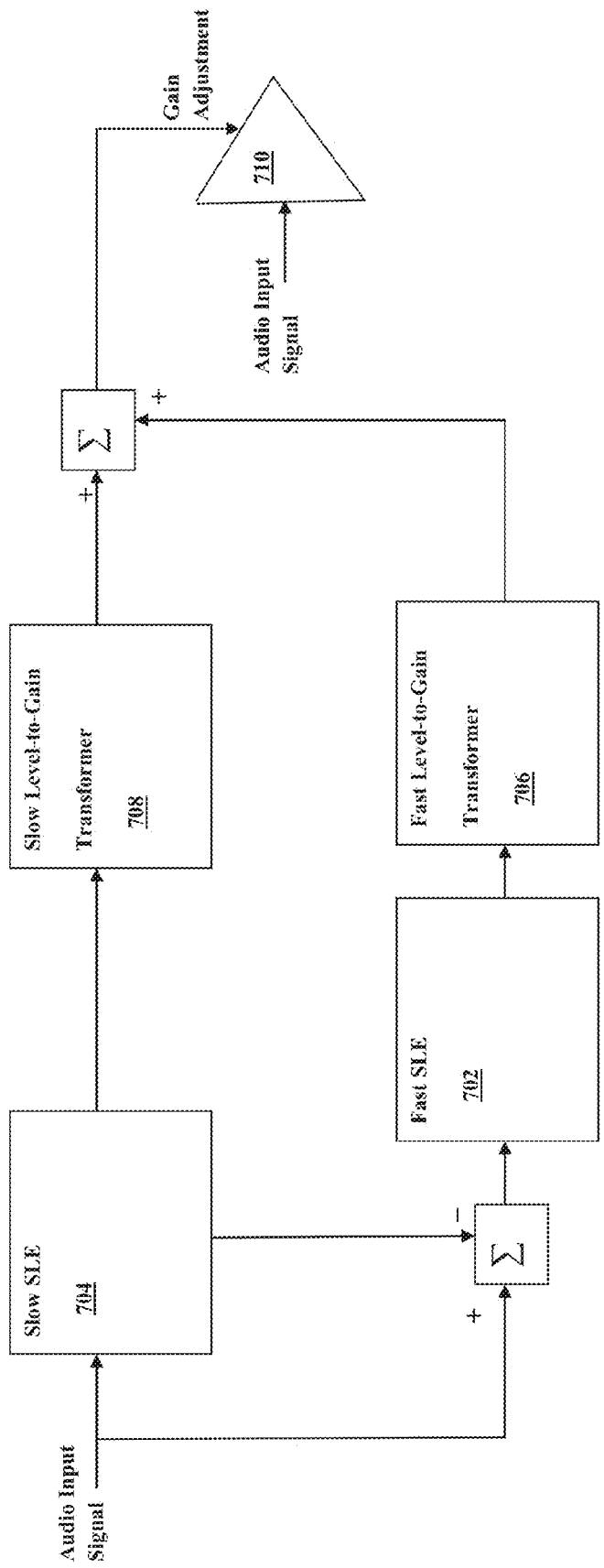
FIG. 7 illustrates a compressor according to one example embodiment.

In a third example embodiment as illustrated by FIG. 7, a device for compressing an audio signal comprises: a fast signal level estimator (fast SLE) 702 and a slow signal level estimator (slow SLE) 704 for receiving the audio signal with each SLE having a low-pass filter characterized by a rise time constant and a decay time constant, a fast level-to-gain transformer 706 for transforming a signal level estimate to a gain value, a slow level-to-gain transformer 708 for transforming a signal level estimate to a gain value, and an output amplifier 710 having an adjustable gain for amplifying the audio signal. The circuitry of the device is configured such that the output of the slow SLE is subtracted from the audio signal and then input to the fast SLE before being input to the fast level-to-gain transformer, the output of the slow SLE is input to the slow level-to-gain transformer, and the gain values of the fast level-to-gain transformer and the slow level-to-gain transformer are summed to adjust the gain of the output amplifier.

In any of the above-described embodiments, the device may comprise a plurality of output amplifiers, fast/slow SLEs, and fast/slow level-to-gain transformers. The device circuitry may be configured so that the gains of the plurality of output amplifiers are adjusted with gain output values for a plurality of frequency-specific channels corresponding to frequency components of the audio signal.

In a fourth example embodiment as illustrated by FIG. 8, a device for compressing an audio signal comprises: a plurality of fast signal level estimators (fast SLE) 802 and slow signal level estimators (slow SLEs) 804a/804b for receiving the audio signal with each signal level estimator having a low-pass filter characterized by a rise time constant and a decay time constant, a plurality of fast level-to-gain transformers 806 for transforming an signal level estimate to a gain value, a plurality of slow level-to-gain transformers 808 for transforming a signal level estimate to a gain value, and a plurality of output amplifiers 810 each having an adjustable gain for amplifying the audio signal. The circuitry of the device is configured to separate the audio signal into a plurality of frequency components that pass through corresponding frequency-specific channels. The described components are replicated for each such frequency-specific channel. For each frequency-specific channel, the device circuitry is configured such that a first slow SLE 804a receives a narrowband component of the audio signal, a second slow SLE 804b receives a wideband component of the audio signal, and the fast SLE 802 receives a wideband component of the audio signal. For each frequency-specific channel, the device circuitry is further configured such that the output of the second slow SLE 804b is subtracted from the output of the fast SLE 802 and then input to the fast level-to-gain transformer 806, the output of the first slow SLE 804a is input to the slow level-to-gain transformer 808, and the gain values of the fast level-to-gain transformer 806 and the slow level-to-gain transformer 808 are summed to adjust the gain of the output amplifier 810. The gain value of the fast level-to-gain transformer 806 is multiplied by a weighting factor by weighting factor module 820 before being summed with the gain value of the slow level-to-gain transformer 808. The weighting factor may be computed by the weighting factor module 820 as a function of the output of the slow SLE 804a.

In any of the above-described example embodiments, the device circuitry may be configured such that such that that the gain value of the fast level-to-gain transformer is multiplied by a weighting factor before being summed with the gain value of the slow level-to-gain transformer. The weighting factor may be computed as a function of the output of the slow SLE.

Any of the above-described example embodiments may be characterized by the following particulars. The rise time constant and the decay time constant of the low-pass filter of the fast SLE may be both less than the rise time constant and the decay time constant of the low-pass filter of the slow SLE. The rise time constant and the decay time constant of the low-pass filter of the fast SLE may both be between 1 millisecond and 10 milliseconds, and the rise time constant and the decay time constant of the low-pass filter of the slow SLE may both be between 100 milliseconds and 1000 milliseconds. The rise time constant may be less than the decay time constant for both low-pass filters of both the slow and fast SLEs. The rise time constant and the decay time constant of the low-pass filter of the fast SLE may be approximately 1 millisecond and 10 milliseconds, respectively, and the rise time constant and the decay time constant of the low-pass filter of the slow SLE may be approximately 100 milliseconds and 1000 milliseconds, respectively. The slow level-to-gain transformer may characterized by expansion below a specified threshold of the output of the slow SLE that corresponds to speech. The slow level-to-gain transformer may be characterized by a region of linear gain at high input levels to minimize distortion. The fast level-to-gain transformer may be characterized by having higher and lower compression thresholds. The fast level-to-gain transformer may be characterized by outputting a constant gain value at input levels below the lower compression threshold. The fast level-to-gain transformer may be characterized by compression limiting at input levels above the higher compression threshold.

The subject matter has been described in conjunction with the foregoing specific embodiments. It should be appreciated that those embodiments may also be combined in any manner considered to be advantageous. Also, many alternatives, variations, and modifications will be apparent to those of ordinary skill in the art. Other such alternatives, variations, and modifications are intended to fall within the scope of the following appended claims.

What is claimed is:

1. A device for compressing an audio signal, comprising
    a fast signal level estimator (fast SLE) and a slow signal level estimator (slow SLE) for receiving the audio signal, each SLE having a low-pass filter characterized by a rise time constant and a decay time constant;
    a fast level-to-gain transformer for transforming a signal level estimate to a gain value;
    a slow level-to-gain transformer for transforming a signal level estimate to a gain value;
    an output amplifier having an adjustable gain for amplifying the audio signal;
    circuitry configured such that the output of the slow SLE is subtracted from the output of the fast SLE and then input to the fast level-to-gain transformer;
    circuitry configured such that the output of the slow SLE is input to the slow level-to-gain transformer;
    circuitry configured so that the gain values of the fast level-to-gain transformer and the slow level-to-gain transformer are summed to adjust the gain of the output amplifier; and,
    circuitry so that the gain value of the fast level-to-gain transformer is multiplied by a weighting factor before being summed with the gain value of the slow level-to-gain transformer.

2. The device of claim 1 further comprising circuitry so that the weighting factor is computed as a function of the output of the slow SLE.

3. The device of claim 1 wherein the fast level-to-gain transformer is characterized by having higher and lower compression thresholds.

4. The device of claim 3 wherein the fast level-to-gain transformer is characterized by outputting a constant gain value at input levels below the lower compression threshold.

5. The device of claim 3 wherein the fast level-to-gain transformer is characterized by compression limiting at input levels above the higher compression threshold.

6. The device of claim 1 wherein the rise time constant and the decay time constant of the fast low-pass filter are both less than the rise time constant and the decay time constant of the slow low-pass filter.

7. The device of claim 1 wherein the rise time constant and the decay time constant of the fast low-pass filter are both between 1 millisecond and 10 milliseconds and the rise time constant and the decay time constant of the slow low-pass filter are both between 100 milliseconds and 1000 milliseconds.

8. The device of claim 1 wherein the rise time constant is less than the decay time constant for both the fast low-pass filter and the slow low-pass filter.

9. The device of claim 1 wherein the rise time constant and the decay time constant of the fast low-pass filter are approximately 1 millisecond and 10 milliseconds, respectively, and the rise time constant and the decay time constant of the slow low-pass filter are approximately 100 milliseconds and 1000 milliseconds, respectively.

10. The device of claim 1 wherein the slow level-to-gain transformer is characterized by expansion below a specified threshold of the output of the slow SLE that corresponds to speech.

11. The device of claim 1 wherein the slow level-to-gain transformer is characterized by a region of linear gain at high input levels to minimize distortion.

12. The device of claim 1 further comprising
    a plurality of output amplifiers, fast/slow SLEs, and fast/slow level-to-gain transformers;
    circuitry configured so that the gains of the plurality of output amplifiers are adjusted with gain output values for a plurality of frequency-specific channels corresponding to frequency components of the audio signal.

13. The device of claim 12 further comprising circuitry configured such that, for each frequency-specific channel, the input to the slow SLE is a narrowband frequency component of the audio signal and the input to the fast SLE is a wideband frequency component of the audio signal.

14. A device for compressing an audio signal, comprising
    a fast signal level estimator (fast SLE) and a slow signal level estimator (slow SLE) for receiving the audio signal, each SLE having a low-pass filter characterized by a rise time constant and a decay time constant;
    a fast level-to-gain transformer for transforming a signal level estimate to a gain value;
    a slow level-to-gain transformer for transforming a signal level estimate to a gain value;
    an output amplifier having an adjustable gain for amplifying the audio signal;
    circuitry configured such that the output of the slow SLE is subtracted from the audio signal and then input to the fast SLE before being input to the fast level-to-gain transformer;
    circuitry configured such that the output of the slow SLE is input to the slow level-to-gain transformer; and, circuitry configured such that the gain values of the fast level-to-gain transformer and the slow level-to-gain transformer are summed to adjust the gain of the output amplifier.

15. The device of claim 14 further comprising circuitry such that that the gain value of the fast level-to-gain transformer is multiplied by a weighting factor before being summed with the gain value of the slow level-to-gain transformer.

16. The device of claim 15 further comprising circuitry so that the weighting factor is computed as a function of the output of the slow SLE.

17. A device for compressing an audio signal, comprising:
a plurality of fast signal level estimators (fast SLEs) and slow signal level estimators (slow SLEs) for receiving the audio signal, each SLE having a low-pass filter characterized by a rise time constant and a decay time constant;
a plurality of fast level-to-gain transformers for transforming a signal level estimate to a gain value;
a plurality of slow level-to-gain transformers for transforming a signal level estimate to a gain value;
a plurality of output amplifiers each having an adjustable gain for amplifying the audio signal;
circuitry configured to separate the audio signal into a plurality of frequency components; and,
for each of a plurality of frequency-specific channels corresponding to the frequency components:
circuitry configured such that a first slow SLE receives a narrowband component of the audio signal, a second slow SLE receives a wideband component of the audio signal, and a fast SLE receives a wideband component of the audio signal;
circuitry configured such that the output of the second slow SLE is subtracted from the output of the fast SLE and then input to a fast level-to-gain transformer;
circuitry configured such that the output of the first slow SLE is input to a slow level-to-gain transformer; and,
circuitry configured such that the gain values of the fast level-to-gain transformer and the slow level-to-gain transformer are summed to adjust the gain of the output amplifier.

18. The device of claim 17 further comprising circuitry such that that the gain value of the fast level-to-gain transformer is multiplied by a weighting factor before being summed with the gain value of the slow level-to-gain transformer.

19. The device of claim 18 further comprising circuitry such that the weighting factor is computed as a function of the output of the first slow SLE.

20. The device of claim 18 wherein the fast level-to-gain transformer is characterized by having higher and lower compression thresholds, the fast level-to-gain transformer is characterized by outputting a constant gain value at input levels below the lower compression threshold and characterized by compression limiting at input levels above the higher compression threshold.

* * * * *